(12) United States Patent
Kononchuk et al.

(10) Patent No.: US 6,583,024 B1
(45) Date of Patent: Jun. 24, 2003

(54) HIGH RESISTIVITY SILICON WAFER WITH THICK EPITAXIAL LAYER AND METHOD OF PRODUCING SAME

(75) Inventors: Oleg V. Kononchuk, Brush Prairie, WA (US); Sergei V. Koveshnikov, Vancouver, WA (US); Zbigniew J. Radzimski, Brush Prairie, WA (US); Neil A. Weaver, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/008,440

(22) Filed: Dec. 6, 2001

(51) Int. Cl.$^7$ ............................................. H01L 21/76
(52) U.S. Cl. ................... 438/404; 438/412; 438/406; 257/140; 257/142; 257/313; 257/296; 428/209
(58) Field of Search ................... 438/58, 412, 404, 438/406; 257/140, 142, 313, 296; 428/209

(56) References Cited

U.S. PATENT DOCUMENTS

| | | | |
|---|---|---|---|
| 3,911,559 A | * 10/1975 | Bean et al. ................. 438/412 |
| 3,975,818 A | * 8/1976 | Kaji et al. ................... 438/546 |
| 4,127,932 A | * 12/1978 | Hartman et al. .............. 438/58 |
| 4,338,481 A | 7/1982 | Mandelkorn | |
| 4,638,552 A | 1/1987 | Shimbo et al. | |
| 4,680,604 A | * 7/1987 | Nakagawa et al. .......... 257/142 |
| 4,914,497 A | * 4/1990 | Kondo ......................... 257/296 |
| 4,985,743 A | * 1/1991 | Tokura et al. ............... 257/140 |
| 5,109,258 A | * 4/1992 | Redwine ...................... 257/313 |
| 5,443,032 A | 8/1995 | Vichr et al. | |
| 5,653,803 A | * 8/1997 | Ito ............................... 438/404 |
| 5,943,581 A | * 8/1999 | Lu et al. ...................... 438/386 |
| 6,040,211 A | 3/2000 | Schrems | |
| 6,059,875 A | 5/2000 | Kirkland et al. | |
| 6,162,708 A | 12/2000 | Tamatsuka et al. | |
| 6,326,279 B1 | * 12/2001 | Kakizaki et al. ............. 438/406 |

FOREIGN PATENT DOCUMENTS

| EP | 1 087 041 A1 | 3/2001 | |
|---|---|---|---|
| JP | 0964435 A1 | * 12/1999 | ........... H01L/21/20 |

* cited by examiner

Primary Examiner—Matthew Smith
Assistant Examiner—V. Yevsikov
(74) Attorney, Agent, or Firm—Alston & Bird LLP

(57) ABSTRACT

A silicon wafer having a thick, high-resistivity epitaxially grown layer and a method of depositing a thick, high-resistivity epitaxial layer upon a silicon substrate, such method accomplished by: a) providing a silicon wafer substrate and b) depositing a substantially oxygen free, high-resistivity epitaxial layer, with a thickness of at least 50 $\mu$m, upon the surface of the silicon wafer. The silicon wafer substrate may then, optionally, be removed from the epitaxial layer.

20 Claims, 1 Drawing Sheet

HIGH RESISTIVITY SILICON WAFER WITH THICK EPITAXIAL LAYER AND METHOD OF PRODUCING SAME

FIELD OF THE INVENTION

The present invention relates to a method of producing a high-resistivity silicon wafer. More particularly, the present invention relates to a method of producing a high-resistivity, large-thickness epitaxial layer which is substantially free of oxygen thermal donors.

BACKGROUND OF THE INVENTION

High resistivity silicon wafers have conventionally been used for power devices such as high-voltage power devices and thyristors. More recently, C-MOS devices, Schottky barrier diodes, and other semiconductor devices for use in mobile communications have been developed which require the use of high-resistivity silicon wafers. The high-resistivity wafers tend to decrease the effects of parasitic capacitance among the devices of the wafer, allowing the devices to be more closely packed upon the surface of the wafer while, at the same time, reducing signal transmission loss among the devices.

High-resistivity wafers are generally defined as those silicon wafers with resistivity of 100 $\Omega \cdot$cm or greater, and typically have resistivity of 1000 $\Omega \cdot$cm. The initial resistivity of a wafer is established during crystal growth by the precise addition of dopants to the molten polysilicon from which the silicon crystal is formed. By doping, the resistivity of the crystals can be controlled within close tolerances. However, the initial resistivity may be altered, desirably or undesirably, during subsequent processing of the wafer such that the final resistivity of the wafer may be very different from the resistivity directly after crystal growth.

High-resistivity wafers are typically produced using the Czochralski (CZ) crystal growing method. The CZ method allows wafers having diameters of 200 mm, 300 mm, 400 mm, or larger to be produced. In addition to the large wafer diameter, the CZ method also provides wafers with excellent planar and radial resistivity distribution and lower cost. Good planar resistivity distribution means that the wafer has only minimal variations in resistivity along the plane which was perpendicular to the growth direction of the crystal during crystal growth.

Unfortunately, there are some problems related to the presence of oxygen during the growth of high-resistivity silicon wafers in a CZ apparatus. During crystal growth within a CZ apparatus, oxygen from the quartz crucible tends to be introduced into the silicon crystal and is maintained in the interstitial sites of the silicon crystal lattice. The interstitial oxygen atoms are normally electrically neutral, but the oxygen atoms tend to agglomerate as oxygen-containing thermal donors (OTDs), which become electron donors when subjected to heat in the range of 350° C. to 500° C. Thus, the resistivity of the wafer may be unfavorably decreased by a relatively mild heating due to the contribution of electrons from the OTDs residing in the wafer. The decrease in resistivity due to the oxygen is especially problematic considering that temperatures in the range of 350° C. to 500° C. are commonly encountered during process steps subsequent to wafer fabrication, such as during device fabrication.

As described in European Patent Office publication EP 1087041 A1, there is known a method of producing a high-resistivity wafer having a high gettering effect while preventing the reduction of resistivity due to electrons being donated from OTDs upon subsequent heating cycles of the wafer. The method includes first producing a single crystal ingot having a resistivity of 100 $\Omega \cdot$cm or greater and an initial interstitial oxygen concentration of 10 to 25 parts per million atomic (ppma) by a CZ method. Interstitial oxygen is then precipitated with a gettering heat treatment step until the residual interstitial oxygen concentration in the wafer becomes about 8 ppma or less. The precipitated oxygen does not have the ability to donate electrons like the OTDs formed from the interstitial oxygen so subsequent heat treating processes do not result in a reduction in resistivity. The use of the gettering heat treatment step is capable of reducing the oxygen content of a 100 $\Omega \cdot$cm wafer from 10 to 25 ppma to 8 ppma or less while generating or maintaining a bulk defect density of $1 \times 10^8$ to $2 \times 10^{10}$ defects/cm$^3$.

The technique of using oxygen precipitation heat treatments to diminish thermal donors within the silicon crystal suffers from two drawbacks. The main drawback with the above described heat treatment is the process time and overall power requirements necessary to precipitate the oxygen within the wafer. Typically, for example, the heat treatment process may require a first heating step of 800° C. for 4 hours, a second heat treating step of 1000° C. for 10 hours, and a third heat treatment step of 1050° C. for 6 hours. Secondly, minimal amounts of interstitial oxygen do remain within the crystal after heat treatment and may contribute to minor fluctuations in resistivity within the wafer caused by heat treatments subsequent to the oxygen precipitation heat treatment process.

What is needed is a method of providing a high-resistivity material which does not require extended processing time and high energy thermal inputs and which does not contain appreciable amounts of residual interstitial oxygen within the silicon lattice.

SUMMARY OF THE INVENTION

The invention is a silicon wafer having a thick, high-resistivity epitaxially grown layer and a method of depositing a thick, high-resistivity epitaxial layer upon a silicon substrate. The epitaxial layer is substantially oxygen free and, therefore, thermal donation from interstitial oxygen atoms does not alter resistivity during heat treatment of the epitaxial layer or the underlying silicon substrate.

A method of obtaining a wafer exhibiting high resistivity while avoiding the reduction of resistivity due to the generation of oxygen donors is accomplished by: a) providing a silicon wafer substrate and b) depositing a substantially oxygen free, high-resistivity epitaxial layer, with a thickness of at least 50 $\mu$m, upon the surface of the silicon wafer. The high-resistivity epitaxial layer has a resistivity of at least 100 $\Omega \cdot$cm and preferably greater than 1000 $\Omega \cdot$cm.

The resulting wafer has high-resistivity in the region surrounding the semiconductor devices fabricated within the surface of the wafer. Also, the region of the wafer surrounding the devices has a very stable resistivity because no oxygen is present in the epitaxial layer.

After growth of the high-resistivity epitaxial layer, the epitaxial layer is optionally separated from the silicon substrate, leaving a high-resistivity silicon material which has been grown completely by epitaxial deposition and which has very low oxygen content.

BRIEF DESCRIPTION OF THE DRAWINGS

Figure 1:
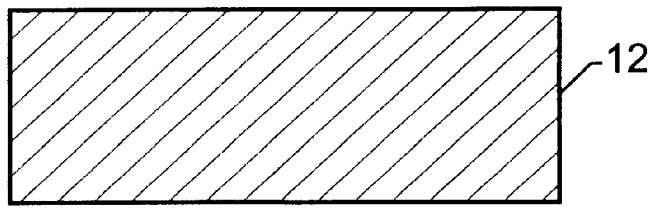
Figure 2:
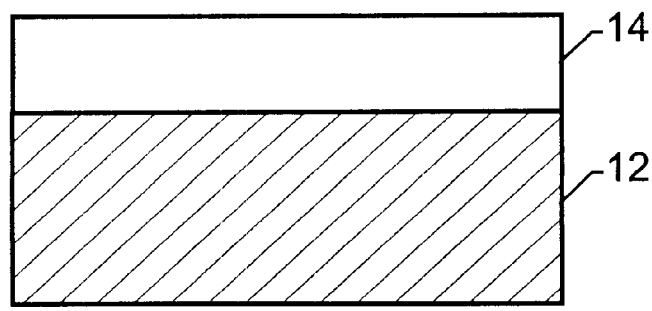
Figure 3:
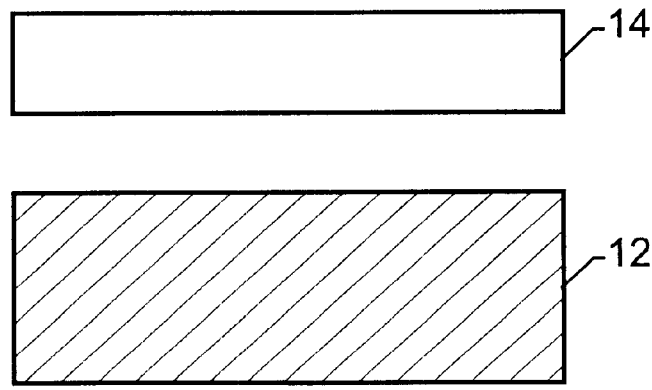

Having thus described the invention in general terms, reference will now be made to the accompanying drawings, which are not necessarily drawn to scale, and wherein:

FIG. 1 illustrates a silicon substrate;

FIG. 2 illustrates a silicon wafer having a high-resistivity, thick epitaxial layer according to one embodiment of the invention; and FIG. 3 illustrates a silicon wafer having a high-resistivity, thick epitaxial layer separated from the silicon substrate according to another embodiment of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A method of obtaining a wafer exhibiting high resistivity while avoiding the reduction of resistivity due to the generation of oxygen donors is accomplished by: a) providing a silicon wafer substrate and b) depositing a substantially oxygen free, high-resistivity epitaxial layer, with a thickness of at least 50 $\mu$m, upon the surface of the silicon wafer. The high-resistivity epitaxial layer has a resistivity of at least 100 $\Omega$·cm, typically greater than 1000 $\Omega$·cm, and more typically greater than that of intrinsic silicon.

The resulting wafer has high-resistivity in the region, i.e., the epitaxial layer, surrounding the semiconductor devices installed within the surface of the wafer. Also, the region of the wafer surrounding the devices has a very stable resistivity because substantially no oxygen is present in the epitaxial layer.

a) Providing a Wafer Substrate

As illustrated in FIG. 1, a silicon wafer substrate 12 is provided as a foundation for formation of the epitaxial silicon layer. Since the deposited epitaxial layer has a thickness of 50 $\mu$m or greater, the epitaxial layer acts as both a physical and electronic boundary separating the devices formed within the epitaxial layer and the underlying silicon substrate. Because of the separation, the particular resistivity of the substrate is not critical. However, in general, the silicon substrate should be a polished silicon wafer having an oxygen concentration of 24 ppma or greater. The process of creating silicon wafers, which may be used as the wafer substrate, are well known in the art. The general method of growing silicon ingots and thereafter slicing the ingots into silicon wafers is shown by Ullmann's Encyclopedia of Industrial Chemistry, vol. A23, p.727–731 (1993) and further by Van Zant, Peter, Microchip Fabrication, Fourth Edition, p. 53–55 (2000). Particular examples of wafer production methods are found in U.S. Pat. Nos. 6,117,231 and 5,359,959 to Fusegawa et al.

b) Depositing an Epitaxial Layer

Due to the cost of production associated with the deposition of epitaxial layers, epitaxial layers are typically deposited as relatively thin layers, 5 $\mu$m to 15 $\mu$m, upon grown silicon substrates. In accordance with this invention, however, epitaxial layers are provided with a thickness of at least 50 $\mu$m, and preferably greater than 100 $\mu$m.

The relatively thick high-resistivity epitaxial layer is critical to the operation of devices such as RF devices. Low resistivity near the surface of a wafer increases the noise level of RF signals and degrades the Q-factor of the devices. In high-resistivity wafers, however, these parameters are stable. The 50 $\mu$m or greater thickness of the epitaxial layer provides physical and electrical separation of the devices from the underlying substrate which could have undesirable resistivity characteristics.

As illustrated in FIGS. 2 and 3, an epitaxial layer 14 with a thickness greater than 50 $\mu$m, and preferably greater than 100 $\mu$m, is deposited upon a surface of the silicon substrate. Exemplary thicknesses of the epitaxial layer are from about 50 $\mu$m to about 200 $\mu$m, more particularly from about 75 $\mu$m to about 150 $\mu$m, and even more particularly from about 100 $\mu$m to about 125 $\mu$m. Deposition of the epitaxial layer provides an wafer having a high resistivity, defect free surface.

Devices which require a high-resistivity substrate are effected by the characteristics of the substrate up to a depth of approximately 100 $\mu$m. Therefore, high-resistivity epitaxial layers having a thickness of 50 $\mu$m or more, and especially 100 $\mu$m or more, effectively isolate the devices from the underlying silicon substrate.

Prior to any epitaxial deposition, the surface of the silicon substrate is preferably polished and cleaned. The surface is polished to remove any imperfections thereon, resulting from the cutting and/or sawing of the substrate from the crystal ingot, and to provide a substantially smooth flat surface. The cleaning is accomplished by washing the surface, preferably with a solution of water, hydrogen peroxide, and ammonia in the ratio of about 4:1:1, though other cleaning solutions known in the art may also be used.

Before the thick epitaxial layer 14 is deposited upon the substrate wafer, the substrate is optionally heated to a temperature above 900° C. in order to create a denuded zone (DZ) at the surface of the substrate wafer. The temperature may vary anywhere from approximately 900° C. to just below the melting temperature of silicon, and is preferably 1100° C. to 1250° C. Time of the denuding heat treatment is from 30 seconds to several minutes and preferably takes place in an inert gas, hydrogen, or a mixture thereof. The denuding heat treatment allows the oxygen near the surface of the substrate to be out-diffused. Out-diffusing the oxygen from the surface portion of the substrate significantly decreases the crystal defects in the surface portion of the substrate and prevents the deterioration of an epitaxial layer 14 by defects which would have existed in the underlying silicon substrate.

The epitaxial layer 14 may be deposited on the substrate 12 surface by any of a variety of methods known in the art of silicon wafer fabrication. An exemplary method of growing the epitaxial layer is described in U.S. Pat. No. 3,945,864, incorporated herein by reference, involving a) heating the substrate to between about 1050° C. and 1200° C. in a reaction vessel, b) etching the surface of the substrate with HCl in a carrier gas, c) purging the HCl gas from the reaction vessel, and d) reacting dichlorosilane and hydrogen gas in the reactor furnace to grow the epitaxial layer 14 of silicon at a growth rate of at least 5 $\mu$m/minute. In practice, trichlorosilane, tetrachlorosilane, or a number of other silane based gases may optionally be used in place of dichlorosilane.

According to the present invention, the epitaxial layer 14 has a high-resistivity. For example, the epitaxial layer has a resistivity of at least 100 $\Omega$·cm, more preferably at least 1000 $\Omega$·cm, and even more preferably at least that of intrinsic silicon (approximately $3.4 \times 10^5$ $\Omega$·cm). Moreover, since the epitaxial layer is substantially free of oxygen thermal donors, the resistivity of the epitaxial layer will not change, i.e., will not decrease, as the wafer is subsequently subjected to elevated temperatures during device fabrication. By being substantially free of oxygen thermal donors, the epitaxial layer preferably has an interstitial oxygen concentration of no more than $1\times10^{17}$ per cm$^3$ and, more preferably, no more than $1\times10^{16}$ per cm$^3$.

Because the epitaxial layer is substantially free of oxygen thermal donors, there is no need for a slow and expensive oxygen precipitation heat treatment step in order to prevent thermal donors from providing electrons to the wafer. Thus, costs associated with such a heat treatment are saved.

Additionally, the epitaxial layer is preferably quite thick. In this regard, the epitaxial layer is sufficiently thick that the devices that are subsequently fabricated upon the wafer are completely contained within the high-resistivity epitaxial layer. Depending upon the frequency of an RF device, the device may be adversely effected by the resistivity of the surrounding wafer. Devices operating at certain frequencies may be effected by the properties of a portion of wafer up to 100 $\mu$m away from the devices. Therefore, even though most semiconductor devices extend no more than about 10 $\mu$m into the surface of wafer, the epitaxial layer preferably has a thickness of at least 50 $\mu$m, and more preferably at least 100 $\mu$m.

After the epitaxial layer 14 is formed on the surface of the substrate 12, the silicon wafer substrate 12 may be reduced or even removed from the epitaxial layer. The silicon substrate 12 may be reduced using wafer grinding methods commonly known in the art. The substrate is optionally ground to a thickness of about 200 $\mu$m. Further, the substrate is optionally ground completely away from the epitaxial layer. Alternatively, the silicon substrate 12 may be removed completely from the epitaxial layer 14 by physical, mechanical, or chemical means.

The thick, high-resistivity epitaxial layer of the present invention resists changes in resistivity during device fabrication heat treatments since the epitaxial layer is substantially free of oxygen thermal donors. Further, the thick epitaxial layer isolates devices installed therein from underlying silicon substrates which may have varying resistivities which would otherwise negatively affect the operation of the device. No oxygen precipitation heat treatment is required with use of the thick epitaxial layer, thus costs associated with such heat treatment are eliminated.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for producing a high-resistivity silicon wafer, comprising:

providing a silicon wafer substrate, and depositing an epitaxial layer upon the surface of the silicon wafer substrate, wherein the epitaxial layer has a thickness of at least about 50 $\mu$m, a resistivity of at least 100 $\Omega$·cm, and an interstitial oxygen content less than $1\times10^{17}$ per cm$^3$.

2. The method of claim 1, wherein the epitaxial layer has a thickness between about 75 $\mu$m and about 150 $\mu$m.

3. The method of claim 1, wherein the epitaxial layer has a thickness between about 100 $\mu$m and 125 $\mu$m.

4. The method of claim 1, wherein the epitaxial layer has a resistivity of at least 1000 $\Omega$·cm.

5. The method of claim 1, wherein the epitaxial layer has a resistivity of at least that of intrinsic silicon.

6. The method of claim 1, further comprising the step of polishing the surface of the silicon substrate prior to deposition of the epitaxial layer.

7. The method of claim 1, further comprising the step of reducing the thickness of the silicon wafer substrate after deposition of the epitaxial layer.

8. The method of claim 7, wherein the step of reducing the wafer substrate comprises grinding the surface of the wafer substrate opposite the surface upon which epitaxial deposition has been received.

9. The method of claim 8, wherein the step of grinding the wafer substrate comprises grinding the wafer substrate to a thickness of about 200 $\mu$m.

10. The method of claim 1, further comprising the step of providing a denuded zone (DZ) on the surface of the wafer prior to depositing the epitaxial layer by performing a high-temperature heat treatment at 900° C. or higher.

11. The method of claim 1, further comprising the step of separating the epitaxial layer from the silicon substrate after deposition of the epitaxial layer.

12. The method of claim 1, wherein the step of depositing an epitaxial layer comprises a) heating the silicon substrate to between about 1050° C. and 1200° C. in a reaction vessel, b) etching the surface of the substrate with HCl in a carrier gas, c) purging the HCl gas from the reaction vessel, and d) reacting a silane based gas and hydrogen gas in the reactor furnace.

13. The method of claim 12, wherein the step of reacting a silane based gas and hydrogen gas comprises reacting a gas selected from dichlorosilane, trichlorosilane, and tetrachlorosilane.

14. The method of claim 13, wherein the epitaxial layer has a thickness between about 75 $\mu$m and about 150 $\mu$m.

15. The method of claim 14, wherein the epitaxial layer has a thickness between about 100 $\mu$m and 125 $\mu$m.

16. A silicon wafer comprising:

a silicon wafer substrate layer; and an epitaxial layer with a resistivity of 100 $\Omega$·cm, a thickness of at least about 50 $\mu$m, and an interstitial oxygen content less than $1\times10^{17}$ per cm$^3$.

17. The wafer of claim 16, wherein the epitaxial layer has a thickness between about 75 $\mu$m and about 150 $\mu$m.

18. The wafer of claim 17, wherein the epitaxial layer has a thickness between about 100 $\mu$m and 125 $\mu$m.

19. The wafer of claim 16, wherein the epitaxial layer has a resistivity of 1000 $\Omega$·cm or greater.

20. The wafer of claim 19, wherein the epitaxial layer has a resistivity at least that of intrinsic silicon.

* * * * *

UNITED STATES PATENT AND TRADEMARK OFFICE
CERTIFICATE OF CORRECTION

PATENT NO.    : 6,583,024 B1                                                                    Page 1 of 1
DATED         : June 24, 2003
INVENTOR(S)   : Kononchuk et al.

It is certified that error appears in the above-identified patent and that said Letters Patent is hereby corrected as shown below:

Title page,
Item [56], References Cited, FOREIGN PATENT DOCUMENTS, "JP" should read -- EP --.

Column 6,
Line 3, "$1x1O^{17}$" should read -- $1x10^{17}$ --.

Signed and Sealed this

Twenty-eighth Day of October, 2003

JAMES E. ROGAN
*Director of the United States Patent and Trademark Office*